(12) United States Patent
Tao et al.

(10) Patent No.: US 11,220,098 B2
(45) Date of Patent: Jan. 11, 2022

(54) IMAGEABLE COATING LAYER, THERMAL NEGATIVE-WORKING LITHOGRAPHY PRINTING PLATE, AND PLATEMAKING METHOD THEREFOR

(71) Applicant: ZHEJIANG KONITA NEW MATERIALS CO., LTD., Zhejiang (CN)

(72) Inventors: Ting Tao, Zhejiang (CN); Nganhau Yung, Zhejiang (CN); Zuoting Ying, Zhejiang (CN); Ying Huang, Zhejiang (CN); Miao Gao, Zhejiang (CN); Nengping Xu, Zhejiang (CN); Chongshuang Liu, Zhejiang (CN)

(73) Assignee: ZHEJIANG KONITA NEW MATERIALS CO., LTD., Zhejiang (CN)

( * ) Notice: Subject to any disclaimer, the term of this patent is extended or adjusted under 35 U.S.C. 154(b) by 93 days.

(21) Appl. No.: 16/325,584

(22) PCT Filed: Aug. 17, 2017

(86) PCT No.: PCT/CN2017/097860
§ 371 (c)(1),
(2) Date: Feb. 14, 2019

(87) PCT Pub. No.: WO2018/033115
PCT Pub. Date: Feb. 22, 2018

(65) Prior Publication Data
US 2019/0176460 A1  Jun. 13, 2019

(30) Foreign Application Priority Data

Aug. 19, 2016  (CN) .......................... 201610696312.X

(51) Int. Cl.
| | | |
|---|---|---|
| G03F 7/00 | (2006.01) | |
| B41C 1/10 | (2006.01) | |
| G03F 7/004 | (2006.01) | |
| G03F 7/029 | (2006.01) | |
| G03F 7/033 | (2006.01) | |
| G03F 7/035 | (2006.01) | |
| G03F 7/16 | (2006.01) | |
| G03F 7/20 | (2006.01) | |
| G03F 7/32 | (2006.01) | |

(52) U.S. Cl.
CPC .......... *B41C 1/1016* (2013.01); *B41C 1/1008* (2013.01); *G03F 7/0045* (2013.01); *G03F 7/0295* (2013.01); *G03F 7/033* (2013.01); *G03F 7/035* (2013.01); *G03F 7/162* (2013.01); *G03F 7/168* (2013.01); *G03F 7/2006* (2013.01); *G03F 7/322* (2013.01); *B41C 2210/04* (2013.01); *B41C 2210/06* (2013.01); *B41C 2210/08* (2013.01); *B41C 2210/22* (2013.01); *B41C 2210/24* (2013.01)

(58) Field of Classification Search
CPC ....................................................... G03F 7/32
See application file for complete search history.

(56) References Cited

U.S. PATENT DOCUMENTS

| | | | |
|---|---|---|---|
| 4,045,232 | A | 8/1977 | Parkinson |
| 4,973,572 | A | 11/1990 | DeBoer |
| 4,981,517 | A | 1/1991 | DeSanto, Jr. et al. |
| 5,148,746 | A | 9/1992 | Fuller et al. |
| 5,208,135 | A | 5/1993 | Patel et al. |
| 5,568,768 | A | 10/1996 | Wolfe et al. |
| 5,629,354 | A | 5/1997 | West et al. |
| 5,713,287 | A | 2/1998 | Gelbart |
| 5,887,214 | A | 3/1999 | Kuriu et al. |
| 5,955,238 | A | 9/1999 | Yokoya et al. |

(Continued)

FOREIGN PATENT DOCUMENTS

| | | | |
|---|---|---|---|
| CN | 1356593 | A | 7/2002 |
| CN | 1405014 | A | 3/2003 |

(Continued)

OTHER PUBLICATIONS https://www.pilotchemical.com/productcategory/calfax/ (2021) (Year: 2021).*
First Office Action dated Feb. 24, 2018 in related Chinese Application No. 201610696312.X.
International Search Report dated Nov. 8, 2017 in related International Application No. PCT/CN2017/097860.
Written Opinion dated Nov. 8, 2017 in corresponding International Application No. PCT/CN2017/097860.
Communication Pursuant to Article 94(3) EPC, Second Office Action dated Apr. 20, 2020 in corresponding Europe Patent Application No. 17 84 1087.4.

(Continued)

*Primary Examiner* — Chanceity N Robinson
(74) *Attorney, Agent, or Firm* — Miles & Stockbridge P.C.; Ajay Jagtiani

(57) ABSTRACT

The invention relates to an imageable coating layer, thermal negative-working lithography printing plate, and platemaking method. The coating layer includes constituents in parts by weight: a radically polymerizable compound 20-60 parts, a radiation-absorbing compound 0.5-12 parts, a free radical initiator 1-25 parts, a binding agent 10-70 parts, and a development accelerator 0.5-15 parts. The platemaking method includes the steps: S1, preparing a printing plate precursor that includes a substrate having a hydrophilic surface or is provided with a hydrophilic layer and imageable coating layer covering the substrate; S2, patternedly exposing the printing plate precursor, forming an exposed area and an unexposed area; and S3, removing the unexposed area via a development process. The employment of the imageable coating layer and the plate making method allows the implementation of a flexible development process of "on-press development" or "off-press development" and produces a printing plate provided with great printing performance.

8 Claims, No Drawings

(56) References Cited

U.S. PATENT DOCUMENTS

| | | |
|---|---|---|
| 6,010,824 A | 1/2000 | Komano et al. |
| 6,037,098 A | 3/2000 | Aoai et al. |
| 6,140,392 A | 10/2000 | Kingman et al. |
| 6,153,356 A | 11/2000 | Urano et al. |
| 6,218,076 B1 | 4/2001 | Ogata et al. |
| 6,232,038 B1 | 5/2001 | Takasaki et al. |
| 6,245,481 B1 | 6/2001 | Teng |
| 6,258,510 B1 * | 7/2001 | Maemoto ............... G03F 7/029 430/278.1 |
| 6,264,920 B1 | 7/2001 | Achilefu et al. |
| 6,309,792 B1 | 10/2001 | Hauck et al. |
| 6,478,483 B2 | 11/2002 | Maruyama et al. |
| 6,569,603 B2 | 5/2003 | Furukawa |
| 6,787,281 B2 | 9/2004 | Tao et al. |
| 6,893,797 B2 | 5/2005 | Munnelly et al. |
| 6,899,994 B2 | 5/2005 | Huang et al. |
| 6,992,688 B2 | 1/2006 | Shimazu et al. |
| 7,018,775 B2 | 3/2006 | Tao |
| 7,049,046 B2 | 5/2006 | Tao et al. |
| 7,135,271 B2 | 11/2006 | Kawauchi et al. |
| 7,175,949 B1 | 2/2007 | Tao et al. |
| 7,261,998 B2 | 8/2007 | Hayashi et al. |
| 7,659,046 B2 | 2/2010 | Munnelly et al. |
| 2002/0126189 A1 * | 9/2002 | Gloster ................. C09D 11/38 347/100 |
| 2003/0073033 A1 | 4/2003 | Kawamura et al. |
| 2003/0186174 A1 * | 10/2003 | Nagase ................. G03F 7/322 430/325 |
| 2004/0061763 A1 * | 4/2004 | Wexler ................. B41M 5/506 347/105 |
| 2008/0254390 A1 | 10/2008 | Van Damme |
| 2008/0274427 A1 | 11/2008 | Van Damme |
| 2009/0011832 A1 | 1/2009 | Rofougaran |
| 2009/0110832 A1 * | 4/2009 | Sampei ................ B41C 1/1008 427/288 |
| 2009/0286183 A1 * | 11/2009 | Yu ....................... B41C 1/1025 430/286.1 |
| 2012/0052442 A1 | 3/2012 | Suzuki et al. |
| 2013/0014658 A1 * | 1/2013 | Sato ..................... B41C 1/1008 101/465 |
| 2014/0141374 A1 * | 5/2014 | Savariar-Hauck .... B41C 1/1008 430/283.1 |
| 2016/0214370 A1 | 7/2016 | Hendrikx et al. |

FOREIGN PATENT DOCUMENTS

| | | | |
|---|---|---|---|
| CN | 1984778 A | 6/2007 | |
| CN | 101269564 A | 9/2008 | |
| CN | 101305324 A | 11/2008 | |
| CN | 101316721 A | 12/2008 | |
| CN | 101322075 A | 12/2008 | |
| CN | 102442409 A | 5/2012 | |
| CN | 103797421 A | 5/2014 | |
| CN | 105612057 A | 5/2016 | |
| CN | 106313870 A | 1/2017 | |
| EP | 1182033 A1 | 2/2002 | |
| EP | 1334824 A2 * | 8/2003 | ............ G03F 7/322 |
| EP | 1334824 A2 | 8/2003 | |
| EP | 1342568 A1 | 9/2003 | |
| EP | 1614540 A1 | 1/2006 | |
| EP | 1788431 A2 | 5/2007 | |
| EP | 1788450 A1 | 5/2007 | |
| EP | 1765592 B1 | 1/2009 | |
| EP | 1751625 B1 | 11/2011 | |
| EP | 2753981 B1 | 7/2014 | |
| GB | 2297719 A | 8/1996 | |
| WO | 2000032705 A1 | 6/2000 | |
| WO | 2004101280 A1 | 11/2004 | |
| WO | 2009030279 A1 | 12/2009 | |
| WO | 2013034474 A1 | 3/2013 | |

OTHER PUBLICATIONS

Supplementary European Search Report dated Oct. 4, 2019 in corresponding European Patent Application No. 17 84 1087.4.

Communication Pursuant to Article 94, First Office Action dated Oct. 16, 2019 in corresponding European Patent Application No. 17 84 1087.4.

Cohen, A.B., et al., "Polymer Imaging", Imaging Processes and Material, I.M., Sturge et al., Van Nostrand Reinhold, New York, 1989, pp. 226-262.

Reiser, A., "Photoreactive Polymers:The Science and Technology of Resists", Wiley, New York, 1989, pp. 102-177.

Monroe, B.M., Photopolymers: "Radiation Curing", Science and Technology, S.P. Pappas, Ed., Plenum, New York 1992, pp. 399-440.

* cited by examiner

IMAGEABLE COATING LAYER, THERMAL NEGATIVE-WORKING LITHOGRAPHY PRINTING PLATE, AND PLATEMAKING METHOD THEREFOR

TECHNICAL FIELD

The present invention relates to the field of preparation of lithography printing plate, and more particularly to an imageable coating layer, thermal negative-working lithography printing plate, and platemaking method therefor.

BACKGROUND

The latest development in the field of lithography printing plate is attributed to the increasing popularity of digital technology for computer processing, storage and output of image information electronically. Various new image output methods corresponding to such digital technology have been put into practice. This resulted in a Computer-to-Plate (CTP) Technology in which digitized image information can be loaded on highly convergent radiation such as a laser and the laser is used to directly scan and expose the lithographic printing plate precursor. Such technology has attracted much attention since it no longer relies on the advantages of producing lithography printing plates by using traditional films, and has become one of the important technical topics in the field of lithography printing plates.

In the production process of conventional lithography printing plates, it is necessary to remove the unnecessary photosensitive coating by dissolving with a development solution after exposure, which takes time and increases costs. Especially in recent years, as considered from environment protection, the disposal of waste liquid discharged with a strong alkaline solution in the development processing has become a matter of great concern to the entire industry. Therefore, as a pursuit of further simplifying the platemaking process and reducing the problem of wastewater treatment, various new technologies, including printing plate precursors that can be put on-press without chemical development after exposure, or a production process that can be performed off-press development in a nearly neutral aqueous solution, have become a challenging issue in the field of technology research currently.

As one of the challenging platemaking techniques described above, a printing plate precursor known as "on-press development" or "processless" and a platemaking method thereof have been proposed, and the unexposed portion of the image recording layer of such lithography printing plate precursors can be removed by an ink and/or a dampening solution on the printing press through mechanical contact of the rotating drum, thereby obtaining a lithography printing plate.

Another solution for simplifying the process and solving the problem of treating the waste liquid is to use a nearly neutral aqueous solution for development, which is also known as a "low chemical treatment" platemaking process. Compared with the "processless" technique described above, the "low chemical treatment" has an advantage of being able to detect the quality of the image prior to expose to the printer and to avoid contamination of the unexposed areas by the ambient light. EP 1342568 discloses a method of making a lithography printing plate in which a thermographic precursor comprising hydrophobic thermoplastic polymer particles which are coalesced upon heating can be developed with a protective adhesive. EP 1751625 provides a method of making a lithography printing plate using a photopolymer printing plate precursor, wherein, the developing and gluing occurs simultaneously in a single bath with a protective adhesive, so the process is simplified. Since the unexposed areas on the photopolymer plate are removed by the gluing step, it can be stored in ambient light for a long time before the exposure plate is mounted on the printer, and visible images can be provided before the plate is mounted on the printer. In addition, it has a better cleaning effect to treat with a protective adhesive than to treat with a fountain solution and ink on the printer.

The Chinese patent application document CN101269564A discloses a method for producing thermal negative working lithography printing plate and a developing technology with a printer. The method comprises the steps of coating a negative thermal sensitive imaging element on a hydrophilic offset print substrate, followed by drying to obtain a precursor of thermal negative working lithography printing plate; then forming images by subjecting the precursor to radiation of infrared laser, thereby the non-image parts are removed under the effect of water or a dampening solution to produce a lithographic printing plate.

However, in the method of the above patent application document, image developing is directly carried out on a printing printer after exposure, or a low chemical image developing is performed firstly after exposure, followed by developing on a printing printer. The compositions and contents of the thermal sensitive imaging elements, and the selection of a suitable developing solution, etc. have a great influence on the final platemaking process, but the method in the prior art cannot realize off-press development and on-press development simultaneously, so the platemaking method is monotonous, as a result a user cannot make free selection according to actual requirements.

SUMMARY OF THE INVENTION

Therefore, in order to overcome the defects that the platemaking process of the prior art cannot realize "off-press development" and "on-press development" simultaneously, and has a monotonous development process, the present invention is designed to provide an imageable coating layer, a negative-working lithography printing plate comprising the same and a platemaking method therefor. The present invention has flexible development process and can meet the actual requirements of customers.

The present invention provides an imageable coating layer, comprising the following ingredients in parts by weight:
 a radically polymerizable compound 20 to 60 parts,
 a radiation-absorbing compound 0.5 to 12 parts,
 a free radical initiator 1 to 25 parts,
 a binding agent 10 to 70 parts, and
 a development accelerator 0.5 to 15 parts,
 wherein, the radically polymerizable compound is a polymerizable monomer and/or oligomer that has at least one ethylenically unsaturated double bond;
 the radiation-absorbing compound has a maximum absorption wavelength in the range of 700 nm to 1200 nm;
 the free radical initiator is at least one selected from the group consisting of an onium salt, a trihalomethyl compound, a hexaarylbiimidazole compound, an s-triazine compound or a metallocene compound;
 the binding agent is a polymer that has carbon in its main chain and has an average molecular weight of 2000 to 500000; and
 the development accelerator is a sodium decyl diphenyl ether disulfonate.

Preferably, the imageable coating layer comprises the following ingredients in parts by weight:
  a radically polymerizable compound 30 to 50 parts,
  a radiation-absorbing compound 1 to 10 parts,
  a free radical initiator 1 to 20 parts,
  a binding agent 20 to 60 parts, and
  a development accelerator 1 to 10 parts, Preferably, the polymerizable monomer and/or oligomer is one or more selected from the group consisting of a acrylate, a methacrylate, an urethane acrylate, an urethane methacrylate, an epoxide acrylate or epoxide methacrylate, an acrylate of polyol, a methacrylate of polyol, a polyester acrylate, a polyester methacrylate, a polyether acrylate, and a polyether methacrylate.

Preferably, the radiation-absorbing compound is at least one selected from the group consisting of a cyanine dye, an anthraquinone dye, a phthalocyanine dye, a quinonimine dye or a methine cyanine dye.

Preferably, the polymer that has carbon in its main chain is a polymer derived from repeating units of at least one selected from the group consisting of an acrylic acid, a methacrylic acid, an acrylate, a methacrylate, an acrylamide, a methacrylamide, a styrene and a styrene derivative, an acrylonitrile, a methacrylonitrile, an N-substituted cyclic imide, and a maleic anhydride.

Preferably, the polymer that has carbon in its main chain has an average molecular weight of from 5000 to 100000.

The present invention also provides a platemaking method for a thermal negative-working lithography printing plate using the imageable coating layer, comprising the following steps:
  S1, preparing a printing plate precursor, the said printing plate precursor comprising a substrate having a hydrophilic surface or being provided with a hydrophilic layer and the imageable coating layer covering the substrate;
  S2, patternedly exposing the printing plate precursor, thus forming an exposed area and an unexposed area; and
  S3, removing the unexposed area via a development process Preferably, the development process is any one of the following:
  (i) on-press development, which is performed on a printing press using a dampening solution and/or a lithographic ink;
  (ii) off-press development, which is performed in a plate processor outside a printing press using a developing solution comprising carbonate and/or bicarbonate, wherein the carbonate and/or bicarbonate accounts for 1% to 20% by weight of the developing solution, and the developing solution has a pH value of 6 to 11.

Preferably, the carbonate comprised in the developing solution is an alkali metal carbonate; and the bicarbonate comprised in the developing solution is an alkali metal bicarbonate.

Further, the alkali metal carbonate is at least one selected from the group consisting of sodium carbonate, potassium carbonate or lithium carbonate.

The alkali metal bicarbonate is at least one selected from the group consisting of sodium bicarbonate, potassium bicarbonate or lithium bicarbonate.

Further, the developing solution further comprises at least one selected from the group consisting of a surfactant and/or a water soluble high molecular compound.

The surfactant accounts for 0.1% to 10% by weight of the developing solution.

The water soluble high molecular compound accounts for 0.1% to 20% by weight of the developing solution.

Preferably, the developing solution has a pH value of 7 to 10.

Further, the anionic surfactant is at least one selected from the group consisting of an aliphate, a rosin ester, a hydroxyalkane sulfonate, an alkane sulfonate, a dialkyl sulfosuccinate, a linear alkyl benzene sulfonate, a branched alkyl benzene sulfonate, an alkyl naphthalene sulfonate, an alkyl phenoxyl polyoxyethylene propyl sulfonate, a salt of polyoxyethylene alkyl sulfoyl phenyl ether, a N-methyl-N-oleyl sodium taurocholate, a monoamide N-alkyl sulfosuccinate disodium, a petroleum sulfonate, a sulfated castor oil, a sulfated tallow, a sulfate ester of aliphatic alkyl ester, a salt of alkyl sulfate, a sulfate of polyoxyethylene alkyl ether, a sulfate ester of aliphatic monoglyceride, a sulfate ester of polyoxyethylene alkyl phenyl ether, a sulfate ester of polyoxyethylene styrylphenyl ether, a salt of alkyl phospholipid, a phosphate salt of polyoxyethylene alkyl ether, a phosphate salt of polyoxyethylene alkyl phenyl ether, a partially saponified compound of styrene-maleic anhydride copolymer, a partially saponified compound of olefin-maleic anhydride copolymer or a naphthalene sulfonate formalin condensate.

The nonionic surfactant is a polyoxyethylene alkyl ether, a polyoxyethylene alkyl aryl ether, wherein the aryl may be at least one selected from the group consisting of phenyl, naphthyl or aromatic heterocyclic compound, polyoxyethylene polystyrene phenyl ether, polyoxyethylene polyoxypropylene alkyl ether, polyoxyethylene polyoxypropylene block polymer, partial ester of glycerol aliphatic acid, partial ester of sorbitan aliphatic acid, partial ester of pentaerythritol aliphatic acid, propylene glycol monoaliphatic ester, partial ester of sucrose aliphatic acid, partial ester of polyoxyethylene sorbitan esteraliphatic acid, partial ester of polyoxyethylene sorbitol aliphatic acid, polyethylene glycol aliphatic ester, partial ester of polyglycerol aliphatic acid, polyoxyethylenated castor oil, partial ester of polyoxyethylene glycerol aliphatic acid, aliphatic diethanol amide, N,N-bis-2-hydroxyalkylamine, polyoxyethylene alkyl amine, triethanolamine aliphatic ester or trialkyl amine oxide.

The cationic surfactant is at least one selected from the group consisting of an alkylamine salt, a quaternary ammonium salt, a polyoxyethylene alkylamine salt or a polyethylene polyamine derivative.

The amphoteric surfactant is at least one selected from the group consisting of an amino acid, a betaine or an amine oxide.

The water soluble high molecular compound is at least one selected from the group consisting of a soybean polysaccharide, a modified starch, an arabic gum, a dextrin, a cellulose derivative and a modified product thereof, an amylopectin, polyvinyl alcohol and a derivative thereof, polyvinylpyrrolidone, polyacrylamide, an acrylamide copolymer, a methyl vinyl ether/maleic anhydride copolymer, a vinyl acetate/maleic anhydride copolymer or a styrene/maleic anhydride copolymer.

Further, the developing solution also comprises a defoaming agent, an organic acid, an inorganic acid and an inorganic acid salt.

The antifoaming agent is a siloxane-based self-emulsify and/or a emulsified antifoaming agent.

The organic acid is at least one selected from the group consisting of ethylenediamine tetraacetic acid, citric acid, acetic acid, oxalic acid, malonic acid, salicylic acid, octanoic acid, tartaric acid, malic acid, lactic acid, levulinic acid, p-toluenesulfonic acid, xylenesulfonic acid, phytic acid or an organic phosphonic acid.

The inorganic acid is a phosphoric acid and/or a metaphosphoric acid.

The inorganic salt is at least one selected from the group consisting of ammonium dihydrogen phosphate, diammonium phosphate, sodium dihydrogen phosphate, disodium hydrogen phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate or nickel sulfate.

The substrate having a hydrophilic surface or being provided with a hydrophilic layer is preferably an aluminum substrate treated by electrolytic roughening and anodizing.

In the step S3, prior to the development process, there is a step of preheating the printing plate precursor after exposure.

Further, the imageable coating layer may comprise one or more layers.

The present invention also provides a thermal negative-working lithography printing plate prepared by the above-described platemaking method.

Compared with the prior art, the technical solution of the present invention has the following advantages:

1) The imageable coating layer provided by the embodiments of the present invention is adapted to various development in the process of thermal negative-working lithography printing plate by regulating and controlling the type and content of each component in the imageable coating layer, so a customer can flexibly select the development process according to actual requirements, such as "off-press development" and "on-press development", and the selection of different development processes will not impair the final development effect. Experiments have shown that: in the printing operation life test, whether "off-press development" or "on-press development" is adopted, at least 10000 good sheets can be provided on the press by the final thermal negative-working lithography printing plate using the above imageable coating layer.

2) The embodiments of the present invention provide a platemaking method for a thermal negative-working lithography printing plate using the imageable coating layer. The developing solution selected during the off-press development process mainly comprises carbonate and bicarbonate, and does not comprise highly corrosive alkaline substances, so the method is safer and more environmentally friendly. In addition, carbonate ions and bicarbonate ions can act as buffer agents to prevent pH fluctuation even when the developing solution has been used for a long period of time. Therefore, deterioration of developing performance and generation of development scum due to pH fluctuation are prevented.

3) The embodiments of the present invention provide a platemaking method for a thermal negative-working lithography printing plate, which has the advantages of simple process, reduced fouling, and large operation tolerance.

4) The embodiments of the present invention provide a thermal negative-working lithography printing plate, which has excellent printing performance, and the negative-working lithography printing plate provides at least 10000 good sheets on the printing press in the printing operation life test.

DETAILED DESCRIPTION OF EMBODIMENTS

In order to better illustrate the purpose, technical solution and advantages of the present invention, the present invention is further described in detail with reference to specific embodiments. Apparently, the present invention may be carried out in many different forms and should not be construed as being limited to the embodiments set forth herein. Actually, the embodiments are provided so that this disclosure will be thorough and complete, and will fully convey the idea of the invention to those skilled in the art, the present invention will be limited only by claims.

The term "off-press development" in the context of the present invention refers to a step of removing an image-recording layer of a lithography printing plate precursor by contacting with a liquid (usually a developing solution) in a device (typically an automatic plate processor), thereby exposing the surface of a hydrophilic substrate. The term "on-press development" refers to a step of removing an image-recording layer of a lithography printing plate precursor by contacting with the ink and/or dampening solution on a printing press, thereby exposing the surface of a hydrophilic substrate. The term "processless" refers to a platemaking method, which does not require any mechanical or chemical treatment after exposure and prior to the printing press, unless otherwise specified.

The platemaking method of the lithography printing plate of the present invention will be described in detail hereinafter. In addition, the other steps will be described after the most characteristic step, that is, the development process is illustrated.

A. Development Process:

The platemaking method of the lithography printing plate of the present invention comprises the following steps: removing an unexposed area of an exposed printing plate precursor through a developing process with or without a preheating step. The developing process is any one of the following: (i) on-press development, which is performed on a printing press using a dampening solution and/or a lithographic ink; (ii) off-press development, which is performed in a plate processor outside a printing press using a developing solution comprising carbonate and/or bicarbonate.

a. On-Press Development

The printing plate precursor of the present invention is suitable for "on-press development". For example, mounting the printing plate precursor directly onto the printing press, rotating the plate cylinder while feeding the dampening solution and/or ink to the imageable coating layer of the printing plate precursor. A non-exposure area of the imageable coating layer is removed from the carrier after the plate cylinder has been rotated for a number of revolutions, preferably less than 50 revolutions, wherein the non-exposure area of the imageable coating layer may be removed in any order during printing by a suitable dampening solution, lithographic ink, or a combination of both.

In a preferred embodiment, only the dampening solution is fed to the printing plate at the start of the printing press, and then an ink is fed after a few revolutions of the device.

In another alternative embodiment, the dampening solution and ink can be fed at the same time as the printing press is started, or only ink is fed to the printing plate at the beginning, and then dampening solution is fed after the device has been turned a few turns.

In yet another alternative embodiment, a single-fluid ink can be fed to the printing plate for on-press processing. The single-fluid ink comprises an ink phase (also known as a hydrophobic or oleophilic phase) and a polar phase, wherein the polar phase replaces an aqueous dampening solution used in conventional offset printing. Suitable single-fluid inks have been disclosed, for example, in U.S. Pat. Nos. 4,045,232, 4,981,517 and 6,140,392. In a most preferred embodiment, the single fluid ink comprises an ink phase and a polyol phase, as described in WO 00/32705.

This kind of development process avoids the use of conventional alkaline developing solution and independent developing equipment.

b. Off-Press Development

There is no particular limit for the off-press development processing of the present invention, and the off-press development processing can be carried out any known method. Development can be a so-called "manual" development or "dip" development, or can be accomplished by rinsing with an automatic development device (typically a rinse machine). In the case of "manual" development, the entire imaging element is sanded with a sponge or a cotton pad fully impregnated with a suitable developer (as described below), followed by rinsing with water for development. "Dip" development involves immersing the imaging element in a stirred tank or tray containing a suitable developer, and staying for 10 seconds to 60 seconds (especially 20 seconds to 40 seconds), followed by rinsing with water, with or without a sponge or a cotton pad sanding. The use of automatic developing equipment is well known and generally involves pumping the developer into a developing tank and then ejecting it from a spray nozzle. The imaging element is brought into contact with the developer in a suitable manner. The automatic developing equipment may also comprise a suitable sanding mechanism (such as a brush or a roller) and a suitable number of conveying rollers. Some developing devices comprise a laser exposure device, and comprise an imaging section and a developing section. For example, the rinsing solution (or developer) can be applied to the imaging element in the following manner: sanding, spraying, ejecting, dipping, immersing, slitting, and narrow slit mold coating (see, for example, U.S. Pat. No. 6,478,483, Maruyama et al. FIGS. 1 and 2) or reverse roll coating (as described in FIG. 4 of U.S. Pat. No. 5,887,214, Kurui et al.), or wiping the outer layer with a rinsing solution or allowing it to contact with a glue-containing roller, a dipping pad or an applicator. A rinsing solution, for example, can be used to brush the imaging element or poured onto an imaging surface, or a spray nozzle system, for example, described in EP 1788431 and U.S. Pat. No. 6,992,688 (Shimazu et al.) is used to develop the image by spraying the surface with a force sufficient to remove the unexposed area. Similarly, the imaging element can be immersed in a rinsing solution and sanded by hand or with a device.

Suitable off-press development devices have at least one roller for sanding or brushing the imaging element while applying the developing solution. The unexposed areas of the imaged layer can be more completely and quickly removed from printing plate by using such a rinsing device. Residual developing solution can be removed (for example, using a squeegee or a roller) or left on the resulting printing plate without any rinsing steps. Excess developing solution can be collected in a tank and used several times and replenished from a reservoir if necessary. Developing supplements may have the same concentration as the developing solution used in the rinsing, or be provided in a concentrated form and diluted with water at a suitable time. Fresh liquid may be used throughout the development process, but it is preferable to circulate the developed solution through a filter so that it can be reused. Any filter used to filter the developing solution applied in the development process may be used as long as it is capable of filtering foreign matter mixed in the developing solution. As for the materials of the filter, it is preferable to use a polyester resin, a polypropylene resin, a polyethylene resin, a cellulose resin, cotton, etc. . . . The mesh pore diameter of the filter is preferably 5 μm to 500 μm, more preferably 10 μm to 200 μm, and further preferably 20 μm to 100 μm.

The off-press development step of the present invention is preferably carried out with an automatic processor quipped with a friction element, such as the automatic processor described in U.S. Pat. Nos. 5,148,746 and 5,568,768 and the British Patent 2297719, particularly preferably an automatic processor with a rotating brush roller as a friction element. The lithography printing plate precursor of the exposed image is subjected to a friction treatment while being transmitted. For the rotating brush roller, a known rotating brush roller manufactured by inserting a brush material into a plastic or metal roller can be used. As for the materials of the brush, a plastic fiber (for example, a polyester base such as polyethylene terephthalate or polybutylene terephthalate, a polyamide base such as nylon 6.6 or nylon 6.10, a polyacrylic acid base such as, polyacrylonitrile or polyalkyl (meth) acrylate and a polyolefin base, for example, polypropylene or polystyrene) may be used. For example, it is preferably that a brush material having a fiber diameter of 20 μm to 400 μm and a length of 5 mm to 30 mm can be used. The outer diameter of the rotating brush roller is preferably from 30 mm to 200 mm, and the peripheral speed of the brush on the friction plate is preferably from 0.1 msec to 5 msec.

The rotation direction of the rotating brush roller may be the same or the opposite direction with respect to the delivery direction of the lithography printing plate precursor. However, when two or more rotating brush rollers are used, with respect to the delivery direction, it is preferred that at least one rotating brush roller rotates in the same direction, and at least one of the rotating brush rollers rotates in the opposite direction. With such a configuration, the non-image area of the photosensitive layer is removed more stably.

A conventional three-bath developing system can be used in the platemaking method of the lithography printing plate of the present invention.

The three-bath developing system is a method to sequentially perform three treatment steps: an off-press development process, a washing process, and a gluing process, and the treatment liquids in each bath is used to perform respective treatment process, that is, the developing system has at least three treatment baths. In the platemaking method of the lithography printing plate of the present invention, the washing step and the gluing process step may not be performed before and after the above-described off-press developing step, and only the developing process using the above developing solution may be used as a processing step, that is, only a single treatment bath is required (also known as single bath treatment).

The resulting lithography printing plate after rinsing of off-press development can be placed onto a cylinder of the printing press, followed by applying an ink and a dampening solution to the printed side of the imaged and developed element.

It is noted that in the present invention, a drying step may be provided after the development step. In particular, it is preferably provided at the last step of the automatic processor.

c. Developing solution

The developing solution used in the platemaking method of the lithography printing plate of the present invention is a neutral or weakly basic aqueous solution or aqueous dispersion comprising at least carbonate, bicarbonate or a combination thereof. Carbonate ion and bicarbonate ion can act as a buffer agent to prevent pH fluctuation even when the developer has been used for a long period of time. Therefore, it can prevent the deterioration of developing performance and the generation of development scum due to pH fluctuation. In order to allow carbonate ion and bicarbonate ion to be simultaneously present in the developing solution, the present invention preferably uses a combination of carbonate and bicarbonate, or may produce carbonate ions and bicarbonate ions by adding carbonate to a developing solution and followed by adjusting the pH. The carbonate or bicarbonate to be used are not particularly limited, and are preferably alkali metal salts thereof. Examples of alkali salts are lithium carbonate, lithium bicarbonate, sodium carbonate, sodium bicarbonate, potassium carbonate and potassium bicarbonate, wherein sodium carbonate, sodium bicarbonate, potassium carbonate and potassium bicarbonate are preferred, and sodium carbonate and sodium bicarbonate are particularly preferred. Alkali metal salts may be used alone or in combination of two or more of them.

The total amount of the carbonate salt and the bicarbonate salt is preferably from 1% to 20% by weight, more preferably from 3% to 15% by weight, based on the weight of the developing aqueous solution.

The developing solution of the present invention may further comprise a surfactant (for example, an anionic, nonionic, cationic or amphoteric surfactant).

Examples of the anionic surfactant comprises a aliphate, a rosin ester, a hydroxyalkane sulfonate, an alkane sulfonate, a dialkyl sulfosuccinate, a linear alkyl benzene sulfonate, a branched alkyl benzene sulfonate, an alkyl naphthalene sulfonate, an alkyl phenoxyl polyoxyethylene propyl sulfonate, a salt of polyoxyethylene alkyl sulfoyl phenyl ether, a N-methyl-N-oleyl sodium taurocholate, a monoamide N-alkyl sulfosuccinate disodium, a petroleum sulfonate, a sulfated castor oil, a sulfated tallow, a sulfate ester of aliphatic alkyl ester, a salt of alkyl sulfate, a sulfate of polyoxyethylene alkyl ether, a sulfate ester of aliphatic monoglyceride, a sulfate ester of polyoxyethylene alkyl phenyl ether, a sulfate esters of polyoxyethylene styrylphenyl ether, a salt of alkyl phospholipid, a phosphate salt of polyoxyethylene alkyl ether, a phosphate salt of polyoxyethylene alkyl phenyl ether, a partially saponified compound of styrene-maleic anhydride copolymer, a partially saponified compound of olefin-maleic anhydride copolymer or a naphthalene sulfonate formalin condensate. Among these anionic surfactants, a dialkyl sulfosuccinate and an alkyl naphthalene sulfonate are particularly preferred.

Examples of a suitable anionic surfactant include a sodium salt of alkylated naphthalene sulfonates, a disodium methylene-dinaphthyl-disulfonate, a sodium alkyl benzene sulfonate, a sodium alkylphenoxybenzene disulfonate, a sulfonated alkyl diphenyl ether, an ammonium nonadecafluoronanesulphonate or a potassium-sodium dioctylsulfosuccinate.

Suitable examples of nonionic surfactants include a polyoxyethylene alkyl ether, a polyoxyethylene alkyl aryl ether, wherein the aryl may be phenyl, naphthyl or aromatic heterocyclic compound, polyoxyethylene polystyrene phenyl ether, polyoxyethylene polyoxypropylene alkyl ether, polyoxyethylene polyoxypropylene block polymer, partial ester of glycerol aliphatic acid, partial ester of sorbitan aliphatic acid, partial ester of pentaerythritol aliphatic acid, propylene glycol monoaliphatic ester, partial ester of sucrose aliphatic acid, partial ester of polyoxyethylene sorbitan esteraliphatic acid, partial ester of polyoxyethylene sorbitol aliphatic acid, polyethylene glycol aliphatic ester, partial ester of polyglycerol aliphatic acid, polyoxyethylenated castor oil, partial ester of polyoxyethylene glycerol aliphatic acid, aliphatic diethanolamide, N,N-bis-2-hydroxyalkylamine, polyoxyethylene alkyl amine, triethanolamine aliphatic ester or trialkyl amine oxide. Among these nonionic surfactants, a polyoxyethylene alkyl phenyl ether, a polyoxyethylene alkyl naphthyl ether, and a polyoxyethylene-polyoxypropylene block polymer are particularly preferred.

Specific examples of a suitable nonionic surfactant includes an ethylene oxide adduct of sorbitol and/or sorbitan fatty acid ester, a polypropylene glycol glycidyl adduct, a dimethylsiloxane-ethylene oxide block copolymer, a dimethylsiloxane-(propylene oxide-ethylene oxide) block copolymer, and a polyol fatty acid ester.

Cationic surfactant is not particularly limited, and conventional known cationic surfactants for example, a alkylamine salt, a quaternary ammonium salt, a polyoxyethylene alkylamine salt, and a polyethylene polyamine derivative can be used.

Amphoteric surfactants available for the present invention are not particularly limited, and conventional known amphoteric surfactants, for example, an amino acid, a betaine or an amine oxide can be used.

In addition, an ethylene oxide adduct of alkynediols or alkynols, or a surfactant of fluorine group or a silicon group can also be used.

Two or more of water-soluble polymers can be used in combination. The content of water-soluble polymers in the developing solution is preferably from 0.1% to 20% by weight, and more preferably from 0.5% to 10% by weight.

The developing solution of the present invention may further comprise a water-soluble polymer, such as a soybean polysaccharide, a modified starch, an arabic gum, a dextrin, a cellulose derivative (for example, a carboxymethyl cellulose, a carboxyethyl cellulose or a methylcellulose) and a modified product thereof, an amylopectin, a polyvinyl alcohol and a derivative thereof, a polyvinylpyrrolidone, a polyacrylamide, an acrylamide copolymer, a methyl vinyl ether/maleic anhydride copolymer, a vinyl acetate/maleic anhydride copolymer or a styrene/maleic anhydride copolymer, etc.

Among the water-soluble polymers, a soybean polysaccharide, a modified starche, an arabic gum, a dextrin, a carboxymethyl cellulose, a polyvinyl alcohol, etc. are particularly preferable.

Two or more of water-soluble polymers can be used in combination. The content of water-soluble polymers in the developing solution is preferably from 0.1 to 20% by weight, and more preferably from 0.5 to 10% by weight.

In addition to the above components, the developing solution of the present invention may further comprise an antifoaming agent, an organic acid, an inorganic acid, an inorganic salt, etc.

As for the antifoaming agent, a conventional polysiloxane-based self-emulsify or emulsified antifoaming agent is preferably used, and a silicone antifoaming agent is preferably. Any one of an emulsified dispersing antifoaming agent, a dissolving antifoaming agent, etc. can be used. The content of the antifoaming agent is preferably from 0.001% to 1.0% by weight.

Examples of the organic acid include ethylenediamine tetraacetic acid, citric acid, acetic acid, oxalic acid, malonic acid, salicylic acid, octanoic acid, tartaric acid, malic acid, lactic acid, levulinic acid, p-toluenesulfonic acid, xylenesulfonic acid, phytic acid or an organic phosphonic acid, etc. The organic acid can also be used in the form of an alkali salt or an ammonium salt, such as an ethylenediamine tetraacetic acid disodium salt. The content of the organic acid is preferably 0.1% to 5% by weight.

Examples of the inorganic acid or inorganic salt include phosphoric acid, metaphosphoric acid, ammonium dihydrogen phosphate, diammonium phosphate, sodium dihydrogen phosphate, disodium hydrogen phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, nickel sulfate, etc. . . . The content of the inorganic salt is preferably from 0.1% to 5% by weight.

The pH of the developing solution in the present invention is not particularly limited as long as it is a pH exhibiting a buffering effect, and is preferably in the range of 6 to 11, and is particularly preferably in the range of 7 to 10.

B. Printing Plate Precursors:

The lithography printing plate precursor used in the present invention is characterized by having a negative image forming ability. That is, image-exposed areas are cured to form image portions, and the unexposed portions are removed by development processing as described above, thus to form non-image portions.

a. Substrate:

The substrate used in the lithography printing plate precursor of the present invention is not particularly limited, as long as the substrate has a hydrophilic surface, or at least has a surface that is more hydrophilic than the imageable layer. The substrate can be composed of any material commonly used in the preparation of imageable elements such as lithography printing plates, which is usually in the form of sheets, films or foils (or meshes) and has a certain strength stability and ductility, and is resistant to dimensional changes under the conditions of use to ensure that the color is correct during printing. Typically the substrate can be any self-supporting materials, including a polymeric film (eg, a polyester, a polyethylene, a polycarbonate, a cellulose ester polymer, and a polystyrene film), a glass, a ceramic, a metal sheet or foil or a rigid paper (a paper comprising resin or metal coating) or any laminates of these materials (for example a laminate of aluminum foil laminated to a polyester film). Metal supports include a sheet or foil of aluminum, copper, zinc, titanium, and an alloy thereof.

A particularly preferred substrate of the present invention is composed of an aluminum support known in the art, and is produced by grinding and roughing a physical (mechanical) grinding plate, an electrochemical graining plate or a chemical graining plate, followed by treating with acid anodic oxidation. A useful hydrophilic lithography substrate is an aluminum support ground electrochemically and anodized with sulfuric or phosphoric acid.

Sulfuric acid anodization of an aluminum support typically produces 1.5 g/m$^2$ to 5 g/m$^2$, more typically 2.5 g/m$^2$ to 4 g/m$^2$ of oxides (coverage) on the aluminum surface. Phosphoric acid anodizing of aluminum supports typically produces 1 g/m$^2$ to 5 g/m$^2$, more typically 1.5 g/m$^2$ to 3 g/m$^2$ of oxides on the aluminum surface. Higher oxides weight (at least 3 g/m$^2$) provides longer print life when anodized with sulfuric acid.

The anodized aluminum supports may also be treated with materials such as silicates, dextrins, calcium fluozirconates, hexafluorosilicic acids, polyvinylphosphonic acids (PVPA), vinylphosphonic acid copolymers, methacrylic acids or acrylic copolymers to increase hydrophilicity.

The thickness of the substrate can vary but it should be strong enough to withstand the wear of the printing and flexible enough to wind. A commonly used thickness is 0.1 mm to 0.7 mm for a treated aluminum foil.

Furthermore, the substrate may also be a cylindrical surface having an imageable layer thereon, such as a component of a printing press. The use of such an imaging cylinder has been described in U.S. Pat. No. 5,713,287 (Gelbart).

b. Imageable Coating Layer:

The imageable coating layer of the present invention comprises at least a radically polymerizable compound, a radiation-absorbing compound, an initiator, and a binding agent. Furthermore, in the present invention, "a coating comprising an imageable coating layer on a substrate" means a radiation-sensitive composition coating can be provided by direct contact with a substrate, and other layers can also be provided between the substrate and the radiation-sensitive coating or above the radiation-sensitive coating. The presence of any layers, such as a protective layer, a substrate layer, an intermediate layer, a back coating layer, etc. as desired in the lithography printing plate precursor is possible.

Radically Polymerizable Compound

Radically polymerizable compounds are well known to those skilled in the art and have been described in considerable documents, for example: "Photoreactive Polymers: The Science ana Technology of Resists", A. Reiser, Wiley, New York, 1989, pages 102-177, BBMronoe; "Radiation Curing: Science and Technology", S. P. Pappas, Ed., Plenum, N.Y., 1992, pages 399-440; "Polymer Imaging", A. B. Cohen and P. Walker; "Imaging Processes ana Material", I. M. Sturge et al., Van Nostrand Reinhold, N.Y., 1989, pages 226-262. Additionally, useful radically polymerizable components have also been described in European Patent 1182033 (Fujimaki et al.).

According to the present invention, the radically polymerizable compound is a polymerizable monomer and/or oligomer containing at least one ethylenically unsaturated double bond, and may preferably be selected from the group consisting of an acrylate of polyol, a methacrylate of polyol, a polyester acrylate, an urethane methacrylate, an epoxide acrylate, epoxide methacrylate, a polyester acrylate, a polyester methacrylate, a polyether acrylate, a polyether methacrylate.

Suitable free radical polymerizable monomers may include, for example, a poly-functionality acrylate monomer or a poly-functionality methyl acrylate monomer (eg, ethylene glycol, trimethylolpropane, pentaerythritol, ethylene glycol-ethoxylated, acrylate of trimethylolpropane-ethoxylated, methacrylate of trimethylolpropane-ethoxylated, a poly-functionality acrylate-carbamated, a poly-functionality methacrylate-carbamated, acrylate-epoxidized and methacrylate-epoxidized) and an oligoamine diacrylate. In addition to the acrylate groups and methacrylate groups, acrylic monomers or methacrylic monomers may also have other double bonds or epoxide groups. The acrylic monomer or methacrylic monomer may also comprise an acid (e.g. carboxylic acid) or basic (e g amine) functionalities. A useful radically polymerizable compound comprises a dipentaerythritol hexaacrylate, a dipentaerythritol pentaacrylate, a ditrimethylolpropane tetraacrylate, a pentaerythritol tetraacrylate, and other polymerizable monomers that are obvious to those skilled in the art.

The polymerizable compound is present in the composition in an amount sufficient to render the IR radiation-sensitive composition insoluble in the aqueous developer after exposure to radiation. The amount is generally from 20% to 60% by weight, typically from 30% to 50% by weight, based on the dry weight of the radiation-sensitive composition.

Radiation-Absorbing Compound

The radiation-absorbing compound of the present invention is provided by the presence of one or more infrared radiation-absorbing compounds, chromophores or sensitizers, which absorb imaging radiation or make the composition sensitive to infrared radiation that having a maximum wavelength of at least 700 nm and up to or equal to 1400 nm, typically 700 nm to 1200 nm.

A useful infrared radiation-absorbing chromophore includes various infrared sensitive dyes ("infrared dyes"). Examples of a suitable infrared dye include, but is not limited to, an azo dye, a squaraines dye, a croconate dye, a triarylamine dye, a thiazolium dye, an indoonium dye, an oxacyanine dye, an oxazonium dye, a cyanine dye, a merocyanine dye, a phthalocyanine dye, an indocyanine dye, an indotricarbocyanine dye, an oxatricarbocyanine dye, a thiocyanine dye, a thiotricarbonate dye, a cryptocyanine dye, a naphthalocyanine dye, a polyaniline dye, a polypyrrole dye, a polythiophene dye, chalcogenopyryloarylidene and bi(chalcogenopyrylo)chalcogenopyryloarylidene polymethine dye, an oxyindolizine, pyran dye, a pyrazoline azo dye, an oxazine dye, a naphthoquinone dye, an anthraquinone dye, a quinoneimine dye, a polymethin dye, an arylmethine dye, a squarine dye, an oxazole dye, a croconine dye, a porphyrin dye, and any substituted or ionic forms of the above dyes. Suitable dyes have also been described in U.S. Pat. No. 5,208,135 (Patel et al.), U.S. Pat. No. 6,153,356 (Urano et al.), U.S. Pat. No. 6,264,920 (Achilefu et al.), and U.S. Pat. No. 6,309,792 (Hauck et al.), U.S. Pat. Nos. 6,569,603, 6,787,281 (Tao et al.), U.S. Pat. No. 7,135,271 (Kawaushi et al.) and European Patent 1182033 (has been indicated in the above contents) Infrared radiation-absorbing N-alkyl sulfate cyanine dyes are described, for example, in U.S. Pat. No. 7,018,775 (Tao). A general description of a suitable class of cyanine dyes is shown by the formula in paragraph [0026] of WO 2004/101280 (Munnelly et al.).

A suitable dye can be formed by using conventional methods and starting materials or obtained from various commercial sources, including Hayashibara Co., Ltd. (Japan), DKSH Group (Switzerland), and FEW Chemicals (Germany). Other useful dyes used in the near infrared diode laser beam have been described, for example, in U.S. Pat. No. 4,973,572 (DeBoer). Useful infrared radiation-absorbing dyes are available from many commercial sources including Showa Denko (Japan) or they can be prepared by using known starting materials and processes. Still other useful infrared radiation-absorbing compounds are copolymers that may comprise ammonium, sulfonium or iodonium cations and infrared radiation-absorbing cyanine anions or infrared radiation-absorbing oxyphthalocyanine anions boned by covalently, wherein the infrared radiation-absorbing cyanine anions have two or four sulfonates or sulphate groups, as described in U.S. Pat. No. 7,049,046 (Tao et al.).

The infrared radiation-absorbing compound may be present in the IR-radiation sensitive composition (or imageable layer) in an amount of at least 0.5% and up to or equal to 12%, preferably at least 1% and up to or equal to 10%, based on the total amount of solids in the composition, or based on the total dry weight corresponding to the imageable layer.

Initiator

Any free radical initiators capable of generating free radicals upon exposure in the presence of a sensitizer can be used as the free radical initiators of the present invention. A suitable free radical initiator includes, for example, a derivative of acetophenone (such as 2,2, -dimethoxy-2-phenylacetophenone and 2-methyl-1-[4-(methylthio) phenyl)-2-morpholinylpropan-1-one]); benzophenone; benzil; a coumarin (such as 3-benzoyl-7-methoxycoumarin and 7-methoxycoumarin); xanthone; thiaxanthone; benzoin or an alkyl substituted anthraquinone; an onium salt (such as a diaryliodonium hexafluoroantimonate, a diaryliodonium trifluoromethanesulfonate, (4-(2-hydroxytetradecyloxy)phenyl)phenyliodonium hexafluoroantimonate, a triarylsulfonium hexafluorophosphate, a triarylsulfonium p-toluenesulfonate, (3-phenylpropan-2-onyl)triarylphosphonium hexafluoroantimonate and a N-ethoxy(2-methyl)pyridinium hexafluorophosphate and onium salt as described in U.S. Pat. No. 5,955,238 (Yokoya et al.), 6037098 (Aoai et al.) and 5629354 (Westd et al.), a borate (for example, triphenyl (n-butyl) borate tetrabutylammonium, triphenyl (n-butyl) borate tetraethylamine, diphenyliodonate tetraphenylborate, triphenylsulfonium triphenyl(n-butyl)borate and borates as described in U.S. Pat. No. 6,232,038 (Takasaki et al.) and U.S. Pat. No. 6,218,076 (Ogata et al.), s-triazine substituted with an alkyl group (eg, 2,4-bis(trichloromethyl)-6-(p-methoxy-styryl)-8-triazine, 2,4-bis(trichloromethyl)-6-(4-methoxy-naphthalene-1-yl)-s-triazine, 2,4-bis(trichloromethyl)-6-piperidinyl-s-triazine and 2,4-bis(trichloromethyl)-6-[(4-ethoxy-ethylideneoxyl)-phenyl-1-yl]-s-triazines and s-triazines as described in U.S. Pat. No. 5,955,238 (has been indicated in the above contents), U.S. Pat. No. 6,037,098 (has been indicated in the above contents), U.S. Pat. No. 6,010,824 (Komano et al.), and U.S. Pat. No. 5,629,354 (has been indicated in the above contents), and titanocene (bis (4-cyclopentadien-1-yl)bis [2,6-difluoro-3-(1H-pyrrole-1-) phenyl titanium]. Among which, an onium salt, a borate and a s-triazine are preferred free radical initiator. A diaryliodonium salt and a triarylsulfonium salt are a preferred onium salt. A triarylalkylborate salt is preferred borate salts. A trichloromethyl substituted s-triazines is preferred s-triazines.

An initiator composition comprising one or more initiator compounds is present in the radiation-sensitive composition in an amount of from 1% to 25%, preferably at least 2% to 20%, based on the total solid of a radiation-sensitive composition or the dry weight of an imageable coating layer.

Binding Agent:

The binding agent of the present invention is a polymer that has carbon in its main chain, and any one or more of binding agent polymers known in the art for use in a photosensitive layer of a negative lithography printing plate precursor, etc. may be used without limitation.

A useful polymeric binding agent may be homogeneous, i.e., dissolved in a coating solvent, or may be present as discrete particles and include, but is not limited to, acrylic acid, methacrylic acid, a polymer derived from acrylate, a polymer derived from methacrylate, a polyvinyl acetal, a phenolic resin, a polymer derived from styrene and its derivative, an acrylonitrile, a methacrylonitrile, a N-substituted cyclic imide or a maleic anhydride, for example, binding agents as described in European Patent 1182033 (has been indicated in the above contents) and U.S. Pat. No. 6,309,792 (has been indicated in the above contents), U.S. Pat. No. 6,569,603 (has been indicated in the above contents), and U.S. Pat. No. 6,893,797 (Munnelly et al.). Also useful binding agents are the vinyl carbazole polymer described in U.S. Pat. No. 7,175,949 (Tao et al.).

On the other hand, a useful polymeric binding agent can also be particulate polymers that are distributed (usually uniformly) throughout the imageable layer, having an average particle size of from 10 to 10000 nm (typically from 20 to 800 nm). Typically the polymeric binding agents are solids at room temperature and are typically non-elastic thermoplastic. The polymeric binding agents comprise both hydrophilic and hydrophobic regions, which have been believed to be important for increasing the difference between exposed and unexposed regions by promoting development capabilities, and the presence of discrete particles tends to promote unexposed regions. Specific examples of polymeric binding agents of such embodiments have been described in U.S. Pat. No. 6,899,994 (has been indicated in the above contents), WO 2009/030279 (Andriessen et al.), U.S. Pat. No. 7,261,998 (Hayashi et al.), U.S. Pat. No. 7,659,046 (Munnelly et al.) and European Patent 1614540 (Vermeersch et al).

In addition to the polymeric binding agents of the above embodiments, the imageable layer can optionally comprise one or more co-binding agents. A typical co-binding agent includes, for example, a cellulose derivative, polyvinyl alcohol, polyacrylic acid, polymethacrylic acid, polyvinylpyrrolidone, polylactide, polyvinylphosphonic acid, a synthetic copolymer such as a copolymer of alkoxy polyethylene glycol acrylate, a copolymer of alkoxy polyethylene glycol methacrylate.

The polymer used as a binding agent preferably has a typical average molecular weight of from 2,000 to 500,000, preferably from 5,000 to 100,000. The total amount of all binding agent polymers is usually from 10% to 70% by weight, preferably from 20% to 60% by weight, relative to the total weight of the non-volatile components of the composition.

Development Accelerator:

In order to effectively achieve "off-press development" and "on-press development" of the imageable coating layer simultaneously, the composition of the present invention comprises a development accelerator. The development accelerator is a hydrophilic organic compound, for example, a water-soluble organic acid compound such as oxalic acid, lactic acid, tartaric acid, malic acid, gluconic acid, or amino acid, and a salt thereof; an alkyl sulfonic acid and a salt thereof, an alkyl-substituted aryl sulfonic acid and a salt thereof, and an alkylphenol ether sulfosuccinic acid and a salt thereof. These hydrophilic organic compounds may be used alone or in combination of two or more.

Among them, a sodium decyl diphenyl ether disulfonate, with a commercial name Calfax®10L-45, is preferably used.

The development accelerator is added in an amount of from 0.5% to 15% by weight, preferably from 1% to 10% by weight, relative to the total solid component weight of the imageable coating layer.

In addition, the composition of the present invention may also comprises, in regular quantities, various additives, such as a surfactant, a color dye, a contrast dye, a polymerization inhibitor, an antioxidant, or any combination thereof, or any other additives that are commonly used in lithographic techniques.

c. Formation of the Printing Plate Precursor:

A printing plate precursor having an imageable coating layer can be formed in the present invention by suitably applying the above imageable coating layer to the above-described substrate. Specifically, the imageable coating layer is dispersed or dissolved in a suitable coating solvent to form a mixed solution, and suitable equipment and processes such as spin coating, knife coating, gravure coating, mold coating, slot coating, bar coating, wire coating, roll coating or extruder hopper coating are used to apply the mixed solution to the surface of the substrate carrier, or to apply said composition by spraying it onto a suitable support such as a printing cylinder of a printing press. The coating solvent is then removed by drying in an oven at 70° C. to 160° C. to obtain said lithography printing plate precursor.

The selection of solvent to be used herein depends on the properties of polymeric binding agents and other non-polymeric components in the composition. Typically coating solvents used under well known conditions and techniques in the art include, for example, acetone, cyclohexanone, methyl alcohol, ethyl alcohol, propyl alcohol, butanol, methyl ethyl ketone, methyl isobutyl ketone, tetrahydrofuran, 1-methoxy-2-propanol, 2-ethoxyl-ethanol, 2-methoxyethyl acetate, 1-methoxy-2-propyl acetate, dimethoxyethane, methyl lactate, ethyl lactate, N,N-dimethyl formamide, N,N-dimethylacetamide, tetramethylurea, N-methylpyrrolidone, dimethyl sulfoxide, γ-butyrolactone, etc., but is not limited to these solvents. The above solvents may be used alone or in combination of two or more thereof.

The coating weight of the imageable layer after drying is generally at least from 0.1 g/m$^2$ to 5 g/m$^2$, preferably from 0.5 g/m$^2$ to 3 g/m$^2$.

In the lithography printing plate precursor of the present invention, it is also preferred to provide a protective layer comprising one or more surface protective compounds on the imageable coating layer in order to prevent contamination of fat, oil, dust or oxidation and damage caused by scratching. As a material that can be used in the protective layer, either a water-soluble polymer or a water-insoluble polymer can be appropriately selected to be used, or two or more of them can be used in combination as required. Specific examples thereof include an arabic gum, an amylopectin, a cellulose derivative such as a carboxymethyl cellulose, a carboxyethyl cellulose or a methylcellulose, a dextrin, a cyclodextrin, an olefinic alcohol, a polyvinyl alcohol, an olefinic pyrrolidones, a polyvinyl pyrrolidone, a polysaccharide, an acrylic, methacrylic acid or a homopolymer and copolymer of acrylamide, etc. In particular, it is preferable to use a water-soluble polymer compound having excellent crystallinity. Specifically, when a polyvinyl alcohol is used as a main component, it is possible to obtain the most excellent results for basic characteristics such as oxygen barrier properties and development removability.

C. Exposure:

The platemaking method of the lithography printing plate of the present invention comprises a process of exposing the lithography printing plate precursor according to the image, and forming exposure areas and unexposed areas by exposing the printing plate precursor according to the required image in a laser scanning plate making machine. The laser used to expose the printable precursor is typically a diode laser (or laser array) due to reliability and low maintenance of diode laser systems, however, other lasers such as gas or solid lasers can also be used. Combinations of power, intensity and exposure time for laser imaging will be obvious to those skilled in the art. Currently, high performance lasers or laser diodes used in commercially available thermal image imagesetters emit infrared radiation having a wavelength of at least 800 nm and up to or equal to 850 nm or at least 1060 nm and up to or equal to 1120 nm.

An image forming device can function only as a plateetter or it can be directly introduced into a lithography printing press. In the latter case, printing can be started immediately after imaging and development, thereby significantly reducing the installation time of the press. The imaging device can be configured as a flat-bed recorder or a drum recorder in which an imageable member is mounted to the inner or outer cylindrical surface of the drum. A preferred imaging device is available from an image platemaking machine modeled as Kodak Trendsetter® Q800 of the Eastman Kodak Company (Rochester, N.Y., USA), which comprises a laser diode emitting near-infrared radiation having a wavelength of 830 nm. Other optional imaging devices include image plate-making machines of PlateRite 4300 series or 8600 series of Screen Holdings Co., Ltd. (Kamigyo-ku, Kyoto, Japan). Furthermore, useful radiation sources comprise a direct imaging printer that can be used to image the elements, which is attached to a printing plate cylinder. Examples of suitable direct imaging printers include the Heidelberg SM74-DI printing press (available from Heidelberg, Dayton, Ohio). Other suitable imaging sources include Crescent 42T plate platesetter (available from Gerber Scientific, Chicago, Ill.) operating at a wavelength of 1064 nm.

Imaging with infrared radiation can generally be performed at an imaging energy of at least 30 mJ/cm$^2$ and up to or equal to 500 mJ/cm$^2$, typically at least 50 mJ/cm$^2$ and up to or equal to 350 mj/cm$^2$, depending on the sensitivity of the imageable layer.

It can be selected to pre-heat or non-preheat the printing plate precursor according to actual requirements after the exposure and prior to development. In general, a printing plate subjected to pre-heating prior to development has more or less increasing print durability. The imaged lithography printing plate, which is finally produced by the aforementioned development process, is mounted on a printing press, coated with a printing ink and a dampening solution for printing, wherein the fountain solution is not absorbed by unimaged areas (hydrophilic substrate surface uncovered by imaging and rinsing steps), and the ink is absorbed by imaged (unremoved) areas. The ink is then transferred to a suitable receiving material (such as cloth, paper, metal, glass or plastic) to provide the desired impression of the image thereon. If necessary, an intermediate "transfer roller" can be used to transfer ink from the imaging member to the receiving material.

The platemaking of a lithography printing plate provided by the present invention will be described in detail below with reference to specific embodiments. Most compounds of the components in the examples are available from Aldrich Chemical Company (Milwaukee, Wis.) unless otherwise specifically stated below.

Some of the specific components and materials used in the following examples are as follows:

Binding agent A is a polymer dispersion having styrene and polyethylene glycol methyl ether methacrylate dispersed in propanol/water (with a volume ratio of 80/20), and having a solid content of 23.7%, wherein with respect to the total amount of the styrene and polyethylene glycol methyl ether methacrylate, styrene accounts for 90% by weight and polyethylene glycol methyl ether methacrylate accounts for 10% by weight.

Binding agent B is a solution having a polymer in 2-butanone, and having a concentration of 33%. The polymer comprises 80% by weight of methyl methacrylate and 20% by weight of methacrylic acid.

Binding agent C is a polymer solid comprising 20% by weight of vinylcarbazole, 35% by weight of acrylonitrile, 20% by weight of styrene, 10% by weight of methacrylic acid and 15% by weight of polyethylene glycol methyl ether methacrylate.

Binding agent D is a polymer dispersion having styrene and 2-(methacryloyloxy-)ethyldimethyl-(3-sulfopropyl)ammonium hydroxide inner salt dispersed in water and emulsified with sodium dodecyl sulfate, and having a solid content of 23.7%, wherein with respect to the total amount of the styrene and 2-(methacryloyloxy-)ethyldimethyl-(3-sulfopropyl)ammonium hydroxide inner salt, styrene accounts for 90% by weight and 2-(methacryloyloxy-)ethyldimethyl-(3-sulfopropyl)ammonium hydroxide inner salt accounts for 10% by weight.

Binding agent E is a solution having a polymer in in ethylene glycol monomethyl ether and having a concentration of 25%, wherein the polymer comprises 20% by weight of methyl methacrylate, 30% by weight of acrylonitrile, 20% by weight of styrene, 15% by weight of N-isopropylacrylamide, 5% by weight of methacrylic acid and 10% by weight of polyethylene alcohol ether methyl acrylate.

Binding agent F is a polymer dispersion having methyl methacrylate and polyethylene glycol methyl ether methacrylate dispersed in propanol/water (with a volume ratio of 80/20), and having a solid content of 24.0%, wherein with respect to the total amount of the methyl methacrylate and polyethylene glycol methyl ether methacrylate, methyl methacrylate accounts for 92% by weight and polyethylene glycol methyl ether methacrylate accounts for 8% by weight.

Binding agent G is a polymer dispersion having styrene, cyanoethyl acrylate and polyethylene glycol methyl ether methacrylate dispersed in propanol/water (with a volume ratio of 80/20), and having a solid content of 23.8%, wherein with respect to the total amount of the styrene, cyanoethyl acrylate and polyethylene glycol methyl ether methacrylate, styrene accounts for 20% by weight, cyanoethyl acrylate accounts for 70% by weight and polyethylene glycol methyl ether methacrylate accounts for 10% by weight.

Binding agent H is a polymer solution having allyl methacrylate and polyethylene glycol methyl ether methacrylate in 2-butanone and having a solid content of 10%, wherein with respect to the total amount of the allyl methacrylate and polyethylene glycol methyl ether methacrylate, allyl methacrylate accounts for 90% by weight and polyethylene glycol methyl ether methacrylate accounts for 10% by weight.

Binding agent I is a polymer solution having acrylonitrile, methacrylic acid and methyl methacrylate in dimethylacetamide and having a solid content of 20.2%, wherein with respect to the total amount of the acrylonitrile, methacrylic acid and methyl methacrylate, acrylonitrile accounts for 48 mol %, methacrylic acid accounts for 20 mol %, and methyl methacrylate in dimethylacetamide accounts for 32 mol %.

HCD-24 is an infrared radiation absorbing compound having a maximum absorption wavelength of 826 nm, which is commercially available from Hayashibara Co., Ltd. (Okayama, Japan).

IRD-49 is an infrared radiation absorbing compound having a maximum absorption wavelength of 826 nm, which is commercially available from DKSH Group (Zurich, Switzerland).

PI-18 is 2-(4-methoxy-1-naphthyl)-4,6-bis(trichloromethyl)-1,3,5-triazine, which is commercially available from DKSH Group (Zurich, Switzerland).

Irgacure® 250 is (4-methoxyphenyl)[4-(2-methylpropyl)phenyl]iodonium hexafluorophosphate, which is commercially available from Ciba Specialty Chemicals (Tarrytown, N.Y.).

PI-0591 is an iodonium salt initiator, which is commercially available from Tokyo Chemical Industry Co., Ltd., Japan.

Calfax®10L-45 is a sodium decyl diphenyl ether disulfonate, which is available from Pilot Chemical Company (Cincinnati, Ohio, USA).

BYK-341 silicone surface additive is available from Becker, Germany.

TMSPMA represents 3-(methacryloyloxy)-propyltrimethoxysilane.

Developing solution A is a solution prepared as follows: dissolving successively 13 g sodium carbonate and 7 g sodium bicarbonate; 50 g sodium dodecyl benzene sulfonate; 25 g arabic gum; 50 g glycol monophenyl ether; 20 g p-toluenesulfonic acid; and 0.1 g SILFOAM®SE 47 defoamer in 750 g deionized water under stirring; then adding deionized water to 1000 g. The pH of developing solution A is 8.9.

Developing solution B is a solution prepared as follows: dissolving successively 25 g sodium bicarbonate and 5 g sodium carbonate; 50 g sodium n-butyl naphthalene sulfonate; 3.0 g ethylene diamine tetraacetic acid; 0.1 g SILFOAM®SE 47 defoamer in 750 g deionized water with stirring; then adding deionized water to 1000 g. The pH of developing solution B is 7.4.

Embodiment 1

The imageable coating layer of the present embodiment comprises the following ingredients:

| | |
|---|---|
| Binding agent A, | 3.52 g |
| Binding agent B, | 2.58 g |
| Pentaerythritol pentaerylate, | 1.08 g |
| Ditrihydroxy propane tetraacrylate, | 0.60 g |
| HCD-24, | 0.20 g |
| Irgacure ®250, | 0.40 g |
| Calfax ®10L-45, | 0.20 g |
| Methyl violet, | 0.02 g |
| TMSPMA, | 0.02 g |
| BYK-341, | 0.005 g |

Dissolving the above ingredients in a mixed solvent of 20.2 g of 1-methoxy-2-propanol and 10.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer B at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Embodiment 2

The imageable coating layer of the present embodiment comprises the following ingredients:

| | |
|---|---|
| Binding agent C, | 1.00 g |
| Binding agent B, | 1.35 g |
| Dipentaerythritol hexaacrylate, | 1.18 g |
| Pentaerythritol tetraacrylate, | 0.56 g |
| HCD-24, | 0.25 g |
| PI-0591 | 0.40 g |
| PI-18, | 0.18 g |
| Calfax ®10L-45, | 0.30 g |
| Victoria pure blue, | 0.03 g |
| TMSPMA, | 0.02 g |
| BYK-341, | 0.005 g |

Dissolving the above ingredients in a mixed solvent of 23.7 g of 1-methoxy-2-propanol and 10.5 g of 2-butanone, and coating the solution onto an aluminum plate base which has been treated by electrochemical roughening and anodic oxidation using a spin coating method, then drying in an oven at 110° C. for 2 minutes to obtain a first coating having a weight of 1.4 g/m². Then coating a solution of polyvinyl alcohol (5.0 g), polyvinyl imidazole (1.0 g) and water (94.0 g) onto the first coating, and then drying in an oven at 110° C. for 2 minutes to obtain a lithography printing plate precursor with two coatings having a total weight of 2.8 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer A at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Embodiment 3

The imageable coating layer of the present embodiment comprises the following ingredients:

| | |
|---|---|
| Binding agent D, | 4.52 g |
| Binding agent B, | 1.35 g |
| Dipentaerythritol hexaacrylate, | 1.08 g |
| Trimethylolpropane triacrylate, | 0.46 g |
| IRD-49, | 0.25 g |
| PI-0591, | 0.40 g |
| Calfax ®10L-45, | 0.20 g |
| Methyl violet, | 0.02 g |
| TMSPMA, | 0.02 g |
| BYK-341, | 0.005 g |

Dissolving the above ingredients in a mixed solvent of 20.2 g of 1-methoxy-2-propanol and 10.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer A at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Embodiment 4

The imageable coating layer of the present embodiment comprises the following ingredients:

| | |
|---|---|
| Binding agent E, | 4.05 g |
| Binding agent H, | 4.18 g |
| Pentaerythritol pentaerylate, | 1.08 g |
| Pentaerythritol tetraacrylate, | 0.46 g |
| IRD-49, | 0.25 g |
| PI-0591, | 0.41 g |
| PI-18, | 0.12 g |
| Calfax ®10L-45, | 0.20 g |
| Crystal violet, | 0.02 g |
| TMSPMA, | 0.02 g |
| BYK-341, | 0.005 g |

Dissolving the above ingredients in a mixed solvent of 20.5 g of 1-methoxy-2-propanol and 7.5 g of 2-butanone, and coating the solution onto an aluminum plate base which has been treated by electrochemical roughening and anodic oxidation using a spin coating method, then drying in an oven at 110° C. for 2 minutes to obtain a first coating having a weight of 1.4 g/m². Then coating a solution of polyvinyl alcohol (5.0 g), polyvinyl imidazole (1.0 g) and water (94.0 g) onto the first coating, and then drying in an oven at 110° C. for 2 minutes to obtain a lithography printing plate precursor with two coatings having a total weight of 2.8 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer A at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Embodiment 5

The imageable coating layer of the present embodiment comprises the following ingredients:

| | |
|---|---|
| Binding agent F, | 4.52 g |
| Binding agent I, | 2.10 g |
| Dipentaerythritol hexaacrylate, | 1.08 g |
| Ditrihydroxy propane tetraacrylate, | 0.46 g |
| HCD-24, | 0.25 g |
| PI-0591, | 0.40 g |
| Calfax ®10L-45, | 0.20 g |
| Victoria pure blue, | 0.03 g |
| TMSPMA, | 0.02 g |
| BYK-341, | 0.005 g |

Dissolving the above ingredients in a mixed solvent of 20.2 g of 1-methoxy-2-propanol and 9.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer B at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Embodiment 6

The imageable coating layer of the present embodiment comprises the following ingredients:

| | |
|---|---|
| Binding agent G, | 4.52 g |
| Binding agent B, | 1.35 g |
| Pentaerythritol pentaerylate, | 1.08 g |
| Pentaerythritol tetraacrylate, | 0.52 g |
| IRD-49, | 0.26 g |
| Irgacure ®250, | 0.40 g |
| Calfax ®10L-45, | 0.25 g |
| Methyl violet, | 0.02 g |
| TMSPMA, | 0.02 g |
| BYK-341, | 0.005 g |

Dissolving the above ingredients in a mixed solvent of 20.2 g of 1-methoxy-2-propanol and 10.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter. It is possible to choose to rinse with the above developer B at a temperature of 25° C. by using MASTER VIEW developing machine for 35 s, and then to print on the machine; or to choose to mount the exposed precursor directly on the printing machine to print. In a print run life test, the imaged plate provides at least 10000 good sheets on a BeiRen printing machine.

Comparative Example 1

The imageable coating layer of the present comparative example comprises the following ingredients:

| | |
|---|---|
| Binding agent A, | 3.52 g |
| Binding agent B, | 2.58 g |
| Pentaerythritol pentaerylate, | 1.08 g |
| Ditrihydroxy propane tetraacrylate, | 0.60 g |
| HCD-24, | 0.20 g |
| Irgacure ®250, | 0.40 g |
| Methyl violet, | 0.02 g |
| TMSPMA, | 0.02 g |
| BYK-341, | 0.005 g |

Dissolving the above ingredients in a mixed solvent of 20.2 g of 1-methoxy-2-propanol and 10.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter, then rinsed with the above developer B at a temperature of 25° C. by using MASTER VIEW developing machine for 35 s. The non-exposed portion cannot be completely removed and cannot be image printed.

Comparative Example 2

The imageable coating layer of the present comparative example comprises the following ingredients:

| | |
|---|---|
| Binding agent E, | 4.05 g |
| Binding agent H, | 4.18 g |
| Pentaerythritol pentaerylate, | 1.08 g |
| Pentaerythritol tetraacrylate, | 0.46 g |
| IRD-49, | 0.25 g |
| PI-0591 | 0.41 g |
| PI-18, | 0.12 g |
| Crystal violet, | 0.02 g |
| TMSPMA, | 0.02 g |
| BYK-341, | 0.005 g |

Dissolving the above ingredients in a mixed solvent of 20.5 g of 1-methoxy-2-propanol and 7.5 g of 2-butanone, and coating the solution onto an aluminum plate base which has been treated by electrochemical roughening and anodic oxidation using a spin coating method, then drying in an oven at 110° C. for 2 minutes to obtain a first coating having a weight of 1.4 g/m². Then coating a solution of polyvinyl alcohol (5.0 g), polyvinyl imidazole (1.0 g) and water (94.0 g) onto the first coating, and then drying in an oven at 110° C. for 2 minutes to obtain a lithography printing plate precursor with two coatings having a total weight of 2.8 g/m².

The resulting lithography printing plate precursor is subjected to scanning exposure by using a drum with a drum rotation speed of 165 rpm and a laser power of 17 W on a Kodak 800 Quantum-II type CTP platesetter, then rinsed with the above developer A at a temperature of 25° C. by using MASTER VIEW developing machine for 35 s. The non-exposed portion cannot be completely removed and cannot be image printed.

Comparative Example 3

A developer C is used in the present comparative example and is prepared as follows: dissolving successively 50 g of n-butyl naphthalene sulfonates and 3.0 g of ethylene diamine tetraacetic acids; 0.1 g SILFOAM®SE 47 defoamer in 750 g deionized water under stirring; then adding deionized water to 1000 g. The pH of developer C is 6.8.

The imageable coating layer of the present comparative example comprises the following ingredients:

| | |
|---|---|
| Binding agent F, | 4.52 g |
| Binding agent I, | 2.10 g |
| dipentaerythritol hexaacrylate, | 1.08 g |
| Ditrihydroxy propane tetraacrylate, | 0.46 g |
| HCD-24, | 0.25 g |
| PI-0591, | 0.40 g |
| Calfax ®10L-45, | 0.20 g |
| Victoria pure blue, | 0.03 g |
| TMSPMA, | 0.02 g |
| BYK-341, | 0.005 g |

Dissolving the above ingredients in a mixed solvent of 20.2 g of 1-methoxy-2-propanol and 9.5 g of 2-butanone, and coating the solution onto an aluminum plate base which has been treated by electrochemical roughening and anodic oxidation using a spin coating method, then drying in an oven at 110° C. for 2 minutes to obtain a lithography printing plate precursor having a coating weight of 1.4 g/m².

The resulting lithography printing plate precursor is subjected to scanning exposure by using a drum with a drum rotation speed of 165 rpm and a laser power of 17 W on a Kodak 800 Quantum-II type CTP platesetter, then rinsed with the above developer C at a temperature of 25° C. by using MASTER VIEW developing machine for 35 s. The non-exposed portion cannot be completely removed and cannot be image printed.

Apparently, the aforementioned embodiments are merely examples illustrated for clearly describing the present invention, rather than limiting the implementation ways thereof. For those skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. An imageable coating layer, comprising the following ingredients in parts by weight:
a radically polymerizable compound 20 to 60 parts,
a radiation-absorbing compound 0.5 to 12 parts,
a free radical initiator 1 to 25 parts,
a binding agent 10 to 70 parts, and
a development accelerator 0.5 to 15 parts,
wherein the imageable coating layer is compatible with a thermal negative-working lithography printing plate,
wherein, the radically polymerizable compound is a polymerizable monomer and/or oligomer that has at least one ethylenically unsaturated double bond;
the radiation-absorbing compound has a maximum absorption wavelength in the range of 700 nm to 1200 nm;
the free radical initiator is at least one selected from the group consisting of an onium salt, a trihalomethyl compound, a hexaarylbiimidazole compound, an s-triazine compound or a metallocene compound;
the binding agent is a polymer that has carbon in its main chain and has an average molecular weight of 2000 to 500000; and
the development accelerator is a sodium decyl diphenyl ether disulfonate.

2. The imageable coating layer according to claim 1, wherein the polymerizable monomer and/or oligomer is one or more selected from the group consisting of an acrylate, a methacrylate, an urethane acrylate, an urethane methacrylate, an epoxide acrylate or epoxide methacrylate, an acrylate of polyol, a methacrylate of polyol, a polyester acrylate, a polyester methacrylate, a polyether acrylate, and a polyether methacrylate.

3. The imageable coating layer according to claim 1, wherein the radiation-absorbing compound is at least one selected from the group consisting of a cyanine dye, an anthraquinone dye, a phthalocyanine dye, a quinonimine dye or a methine cyanine dye.

4. The imageable coating layer according to claim 1, wherein the polymer that has carbon in its main chain is a polymer derived from repeating units of at least one selected from the group consisting of an acrylic acid, a methacrylic acid, an acrylate, a methacrylate, an acrylamide, a methacrylamide, a styrene and a styrene derivative, an acrylonitrile, a methacrylonitrile, an N-substituted cyclic imide, and a maleic anhydride.

5. The imageable coating layer according to claim 4, wherein the polymer that has carbon in its main chain has an average molecular weight of from 5000 to 100000.

6. A platemaking method for a thermal negative-working lithography printing plate using the imageable coating layer according to claim 1, comprising the following steps:
- S1, preparing a printing plate precursor, said printing plate precursor comprising a substrate which is covered with the imageable coating layer of claim 1, and said substrate having a hydrophilic surface or being provided with a hydrophilic layer;
- S2, patternedly exposing the printing plate precursor, thus forming an exposed area and an unexposed area; and
- S3, removing the unexposed area via a development process.

7. The platemaking method according to claim 6, wherein the development process is any one of the following:
- (i) on-press development, which is performed on a printing press using a dampening solution and/or a lithographic ink; or
- (ii) off-press development, which is performed in a plate processor outside a printing press using a developing solution comprising carbonate and/or bicarbonate, wherein the carbonate and/or bicarbonate accounts for 1% to 20% by weight of the developing solution, and the developing solution has a pH value of 6 to 11.

8. The platemaking method according to claim 7, wherein the carbonate comprised in the developing solution is an alkali metal carbonate; and the bicarbonate comprised in the developing solution is an alkali metal bicarbonate.

* * * * *